US008578251B1

(12) United States Patent
Tang et al.

(10) Patent No.: US 8,578,251 B1
(45) Date of Patent: *Nov. 5, 2013

(54) POWER SAVING AREA-EFFICIENT HYBRID BCH CODING SYSTEM

(71) Applicant: Marvell International Ltd., Hamilton (BM)

(72) Inventors: Heng Tang, Sunnyvale, CA (US); Gregory Burd, San Jose, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/758,664

(22) Filed: Feb. 4, 2013

Related U.S. Application Data

(63) Continuation of application No. 12/038,582, filed on Feb. 27, 2008, now Pat. No. 8,381,082.

(60) Provisional application No. 60/891,872, filed on Feb. 27, 2007.

(51) Int. Cl.
 *H03M 13/03* (2006.01)
(52) U.S. Cl.
 USPC .......................... 714/782; 714/785; 714/759

(58) Field of Classification Search
 USPC ................................ 714/755, 782, 759, 785
 See application file for complete search history.

(56) References Cited

U.S. PATENT DOCUMENTS

| | | | |
|---|---|---|---|
| 4,958,349 A | 9/1990 | Tanner et al. | |
| 5,996,105 A | 11/1999 | Zook | |
| 6,990,624 B2 | 1/2006 | Dohmen et al. | |
| 7,117,420 B1 * | 10/2006 | Yeung et al. | 714/763 |
| 7,350,127 B2 * | 3/2008 | Emmot et al. | 714/752 |
| 8,381,082 B1 * | 2/2013 | Tang et al. | 714/782 |
| 2007/0157064 A1 | 7/2007 | Falik et al. | |

* cited by examiner

*Primary Examiner* — Guy Lamarre

(57) ABSTRACT

Power-saving and area-efficient BCH coding systems are provided that employ hybrid decoder architectures. The BCH decoder architectures comprise both special-purpose hardware and firmware, thereby taking advantage of both the speed of special-purpose hardware and the energy-efficiency of firmware. In particular, the error correction capabilities of the BCH decoders provided herein are split between a hardware component designed to correct a single error and a firmware component designed to correct the remaining errors. In this manner, firmware operation is bypassed in situations where only one error is present and the complexity of the necessary hardware is significantly reduced.

21 Claims, 14 Drawing Sheets

POWER SAVING AREA-EFFICIENT HYBRID BCH CODING SYSTEM

CROSS-REFERENCE TO RELATED APPLICATIONS

This is a continuation of U.S. Pat. No. 8,381,082, issued Feb. 19, 2013 on U.S. patent application Ser. No. 12/038,582, filed Feb. 27, 2008, which claims benefit under 35 U.S.C. §119(e) of U.S. Provisional Application No. 60/891,872, filed Feb. 27, 2007, each of which is hereby incorporated by reference herein in its respective entirety.

BACKGROUND OF THE INVENTION

In general, the invention relates to data processing. In particular, the invention relates to coding data using Bose-Chaudhuri-Hocquenghem (BCH) error-correction codes.

Electronic information is increasingly being relied upon as a preferred medium for conducting business and/or personal transactions. As a result, demands for even better information storage and communication technologies are also increasing. The advances in this area of technology are apparent in telecommunication and information storage devices, where developments in throughput and storage density are allowing users to process information at much greater rates and quantities than before.

To guarantee some degree of information integrity, many communications and storage devices include error-correction technologies. Such technologies generally involve configuring information in a way that allows the information to be recoverable even when parts of the information are altered or missing. In error-correction, this process of configuring information is referred to as "encoding," and the counterpart process of recovering information is referred to as "decoding." Therefore, unless otherwise specified, the term "coding" will be used herein to refer to a particular way of encoding and decoding information.

In the field of error-correction codes, of particular note are BCH codes, which constitute a large class of multiple random error-correcting cyclic codes. In modern day applications, BCH codes are used in information storage and retrieval, communications systems, and many other areas. Despite their algorithmic effectiveness, the suitability of BCH codes in these and other applications may be limited by practical considerations. The computational steps involved in BCH encoding and decoding are relatively complex, and practical issues generally concern the speed and power consumption of the physical implementation of the coding algorithms. The speed of a coding system, which is affected by the system's throughput, is particularly important in applications where near real-time functionality is preferably preserved, such as cellular communication systems. Power consumption continues to be a limiting factor in the microelectronics industry's drive to produce smaller and smaller devices.

Currently, BCH coding schemes are nominally implemented exclusively in special-purpose hardware or exclusively in firmware. Special-purpose hardware systems generally have high throughput, but consume a large quantity of power. Consequently, special-purpose hardware systems often require relatively large silicon areas, among other reasons. Firmware implementations generally operate too slowly.

Thus, neither of the two prevailing methods for implementing BCH codes sufficiently combats limitations in both speed and power consumption.

SUMMARY OF THE INVENTION

In general, in one aspect, BCH decoder architectures are provided that are power-saving and area-efficient.

A communications or storage device may include a BCH encoder and a BCH decoder. The encoder and decoder may collectively be referred to as the coding system of the communications or storage device. The encoder and decoder may be operable to protect a message based on a BCH code with correction power t and generator polynomial g(X). Information provided to the encoder is generally referred to as a "dataword." Information that results from the encoding process is referred to as a "codeword." The codewords received by the decoder may contain any number of errors.

To limit power consumption and silicon area of the coding system while maintaining speed and throughput, BCH decoders may be implemented using a combination of special-purpose hardware and firmware. The hardware portion may be designed to correct a single error in a received codeword, regardless of the number of errors actually present or the correction power of the code. The firmware may be designed to correct up to t errors in the received codeword. When there is at most one error in a received codeword, firmware operation may be bypassed.

In one embodiment, the special-purpose hardware contains two pipelined stages. The first pipeline stage includes a syndrome computer that computes the first syndrome component of the codeword. The first pipeline stage also includes an error detector that operates concurrently as the syndrome computer to determine if any errors are present in the codeword. If the error detector determines that the codeword is free of error, then the codeword is directed to the output of the decoder. If there is at least one error, then the codeword proceeds to the second pipeline stage.

The second pipeline stage includes a polynomial root computation component that corrects a single error based on the computed first syndrome component. An exemplary polynomial root computation component may employ a Chien Search algorithm. The second pipeline stage also includes an error detector that determines if any errors are present in the codeword subsequent to the correction of the single error. If no more errors are detected, then the codeword is directed to the output. If additional errors are still present, then the codeword is directed to the firmware.

The firmware includes a syndrome computer that computes the complete syndrome of the codeword. The firmware also includes a component that computes the error-locator polynomial of the codeword. An exemplary algorithm that may be used to compute the error-locator polynomial is the Berlekamp-Massey algorithm. Finally, the firmware includes a polynomial root computation component that can be used to determine the roots of the error-locator polynomial, and uses the computed roots to correct up to t errors in the codeword. The polynomial root computation component may, for example, employ a Chien Search algorithm.

In another embodiment of the invention, the special-purpose hardware includes a syndrome computer that computes the complete syndrome of the codeword. The special-purpose hardware also includes a single error pattern determiner that determines from the computed syndrome if more than one error is present in the codeword. A look-up table is used to correct the existing errors if at most one error is present in the codeword.

If the single error pattern determiner determines that more than one error is present, then the firmware is used to correct the errors. The firmware includes a component that computes the error-locator polynomial of the codeword. The firmware also includes a polynomial roots solver that determines the roots of the error-locator polynomial, and uses the computed roots to correct up to t errors in the codeword.

In the embodiments described above, the BCH decoder may in many instances avoid slow firmware operation. In addition, since hardware that function to correct only one error may contain less silicon area and use less power than hardware designed to correct t errors, the BCH decoder of the above-described embodiments may also be power-saving and area-efficient. Thus, the hybrid BCH decoder architectures described herein provide novel BCH coding system designs that are both fast and power efficient.

Thus, in one embodiment, a BCH decoder for correcting errors in a BCH codeword is provided. The BCH decoder can be based on a BCH code with correction power t. The BCH decoder can include means for computing a first syndrome component of the codeword and means for correcting a single error in the codeword to produce a corrected codeword. The BCH decoder can also include means for detecting the presence of errors in the corrected codeword and means for correcting up to t errors when errors are detected in the corrected codeword.

In another embodiment, a BCH decoder is provided for correcting errors in a BCH codeword based on a BCH code with correction power t. The BCH decoder can include means for computing a complete syndrome of the codeword and means for determining whether one or no errors are present in the codeword based on the computed complete syndrome. The BCH decoder may further include means for correcting a single error using a first process when only one error is present in the codeword and means for correcting up to t errors using a second process different from the first process when more than one error is present in the codeword.

BRIEF DESCRIPTION OF THE DRAWINGS

The above and other aspects and advantages of the invention will be apparent upon consideration of the following detailed description, taken in conjunction with the accompanying drawings, in which like reference characters refer to like parts throughout, and in which.

DETAILED DESCRIPTION

The disclosed technology is directed toward systems and methods for implementing power-saving and area-efficient BCH coding systems. In applications or devices where information maybe be altered by interference signals or other phenomena, BCH error-correcting codes provide a measured way to protect information against such interference. As used herein, "information" and "data" refer to any unit or aggregate of energy or signals that contain some meaning or usefulness.

Figure 1:
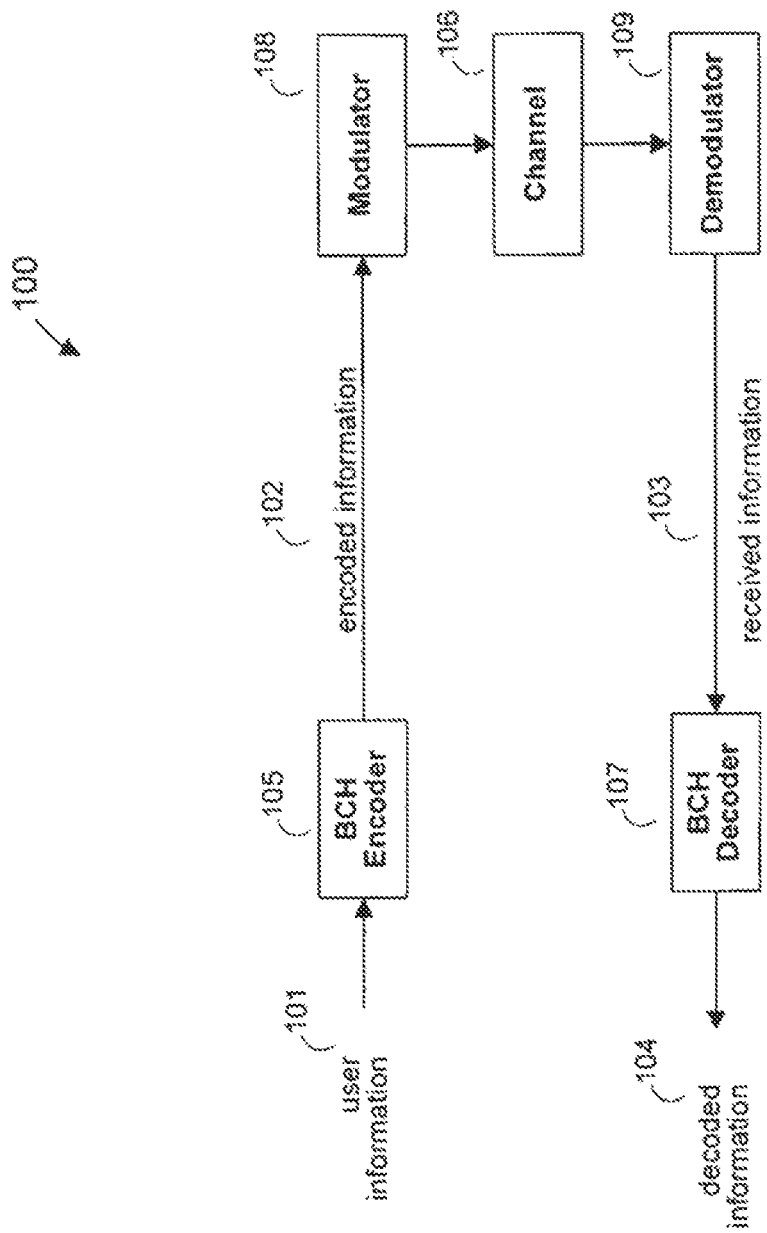
FIG. 1 shows an illustrative block diagram of an error-correcting communication/storage system in accordance with one aspect of the invention.

Referring to FIG. 1, there is shown an illustrative block diagram of an error-correcting communication/storage system 100 that employs BCH coding. The BCH error correction capability of system 100 is embodied in BCH encoder 105 and BCH decoder 107. In general, BCH encoder 105 functions to generate an n-digit word from a k-digit word in a particular way, where n and k are integers and n>k. The k-digit word is called a "dataword," and the n-digit word is called a "codeword."

In particular, in one implementation, each BCH code employed by BCH encoder 105 is defined over a Galois field. Galois fields, also known as finite fields, are fields with a finite number of elements. For every prime number p and positive integer m, there exists a Galois field with $p^m$ elements that is unique up to isomorphism. Accordingly, a Galois field with $p^m$ elements may be uniquely denoted by $GF(p^m)$. Encoder 105 may operate using one or more (n, k, t) BCH codes over $GF(2^m)$, where an (n, k, t) BCH code over $GF(2^m)$ is a binary code that functions to encode a k-bit dataword into a n-bit codeword. The parameter t is know as the correction power of the code, and is equal to the maximum number of errors that is correctable in a codeword. Additionally, the parameters n, k, t, and m are mathematically related in the following manner:

$$n \leq 2^m - 1 \qquad\qquad (Eq.\ 1)$$

$$n - k \leq m \cdot t \qquad\qquad (Eq.\ 2)$$

Equation 2 indicates that the redundancy of a BCH code employed by BCH encoder 105, defined as n−k, satisfies an upper limit. In most BCH codes, however, the equality holds: n−k=m*t. For example, BCH encoder 105 may encode a 512 byte dataword with a binary BCH code over $GF(2^{13})$ with correction power of 4 that requires a redundancy of 52 bits: n−k=m*t=52. Although the above discussion and example is directed towards binary BCH codes, the definitions and relationships may be readily expanded to nonbinary BCH codes over $GF(p^m)$, where p is any prime.

In BCH coding, datawords and codewords are frequently expressed as polynomials, rather than as vectors of bits. For example, if a k-bit dataword is equal to $(u_{k-1}, u_{k-2}, \ldots, u_0)$, where $u_i \in \{0, 1\}$, then the equivalent polynomial expression would be $u(X) = u_{k-1}X^{k-1} + u_{k-2}X^{k-2} + \ldots + u_0$. Similarly, a codeword equal to $(c_{n-1}, c_{n-2}, \ldots, c_0)$ may be expressed as $c(X) = c_{n-1}X^{n-1} + c_{n-2}X^{n-2} + \ldots + c_0$. This parallel maybe extended to nonbinary BCH codes, where each $u_i$ and $c_i$ may be a symbol over $GF(p^s)$, where $s \leq m$. Each BCH code is characterized by a set of 2t "minimal polynomials" $\{\Phi_1(X), \Phi_2(X), \ldots, \Phi_{2t}(X)\}$. The least common multiple of these minimal polynomials is call the code's generator polynomial g(X), and is a common factor for all valid codewords c(X). Generator polynomial g(X) is the lowest-degree polynomial that has $(\alpha, \alpha^2, \alpha^3, \ldots, \alpha^{2t})$ as its roots.

With the continued reference to FIG. 1, BCH encoder 105 may be operable to encode user information 101 that is intended for communication/storage. User information 101 may include a series of datawords, and may be provided by any suitable type of information source, such as a source encoder, an electrical storage device, an optical storage device, or a magnetic storage device. For storage systems, user information 101 may be grouped into units referred to as "pages" for storage in a storage medium, and each page may include multiple datawords. For example, a storage system may store 2K byte pages, each of which may be provided to the storage medium in a series of four 512 byte datawords. User information 101 may also be nonbinary.

Figure 2:
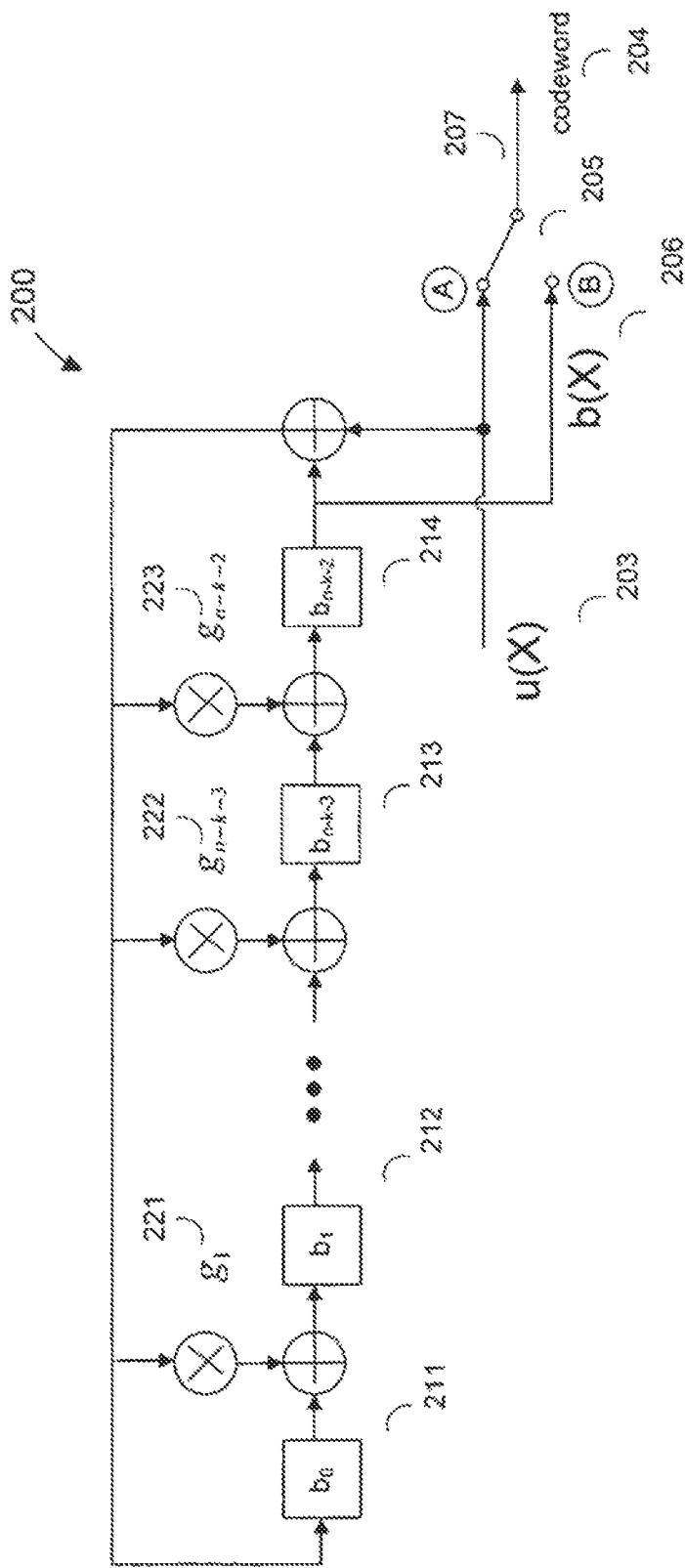
FIG. 2 shows an illustrative block diagram of a Linear Feedback Shift Register (LFSR) that may be used to implement a BCH encoder.

User information 101 may be encoded by BCH encoder 105 to generate encoded information 102. There are many methods for implementing BCH encoder 105. A simplified block diagram of a system that may be used to implement BCH encoder 105 in one embodiment of the invention is shown in FIG. 2.

Encoded information 102 may include a series of codewords, and may be binary or nonbinary. Encoded information 102 may be modulated by modulator 108, which may perform electric-, magnetic-, or optical-based modulation, or another type of modulation. Modulator 108 may use an appropriate modulation scheme, such as QAM, PAM, or PSK, to transform encoded information 102 into one or more signals (not shown) that may be communicated over communications/storage channel 106, where encoded information 102 may be affected by noise. As used herein, "channel" refers to media, device, and/or processing stages that occur between modulator 108 and demodulator 109 and can correspond to a particular path of media/devices through which a signal can flow, a particular wavelength or time slot which a signal can utilize, and/or another multiple access scheme. For example, in FIG. 1, channel 106 may correspond to storage and write and read components of a disk drive, including a magnetic storage medium, a disk-drive read/write head, and other storage system components. While in channel 106, the signals may encounter error-producing phenomena, such as device physical failure, device electronic failure, signal interference, and/or data loss due to buffer overflow, for example. The interference signals and other error-producing phenomena in a channel 106 will be referred to herein as "noise." As shown by the description above, the terms channel and noise are ore conceptual than physical, but they correspond to physical aspects of a system.

With continued reference to FIG. 1, the signals on channel 106 may be received by a demodulator 109. The demodulator 109 attempts to determine encoded information 102 from a noisy signal. Demodulator 109 may, in certain embodiments, detect the carrier wave of a signal produced by modulator 108. Demodulator 109 may include circuitry to implement envelope detection, quadrature detection, and may include the use of phase-locked loops. Demodulator 109 may also include analog to digital converters that derive digital bits from noisy analog signals on channel 106.

The output of demodulator 109 is received information 103. Due at least in part to the noise on channel 106, received information 103 may include a series of codewords corrupted with errors. Such errors may be distributed randomly throughout received information 103, or may be grouped in bursts at particular locations in received information 103. In binary codes, knowing the location of an error may be sufficient for correcting the error, since only a bit flip is required. In nonbinary codes, additional information may be required to correct a detected error, such as the correct value of the codeword.

BCH decoder 107 receives received information 103 and outputs decoded information 104. BCH decoder 107 may or may not be able to correct the errors in received information 103. One scenario in which decoder 107 may not be able to correct the errors in received information 103 is when the number of errors in an n-length received codeword exceeds the correction power t of the employed BCH code. For example, a number of errors greater than t may occur such that the received codeword forms a different valid codeword than the codeword originally transmitted/stored, thereby rendering the errors undetectable. BCH decoder 107 may be implemented in a variety of ways. FIGS. 3-6 describe methods of implementing BCH decoder 107 according to different embodiments of the invention.

Referring now to FIG. 2, there is shown a block diagram of a Linear Feedback Shift Register (LFSR) circuit 200 that may be used to implement BCH encoder 105. LFSR 200 may be a systematic BCH encoder that encodes a dataword into a codeword for transmission through channel 207. A dataword is illustrated in FIG. 2 as user data polynomial u(X) 203. As discussed previously, a k-digit dataword in BCH coding may be equivalently represented as a k−1 degree polynomial, where the coefficients of the polynomial are equal to the dataword digits. LFSR 200 may shift u(X) 203 into channel 207 as the first k digits of codeword 204. This may be done when switch 205 is in position A.

Gains 221-223 are the coefficients of the generator polynomial g(X) that is associated with the BCH code being implemented. LFSR 200 may compute $b(X) = X^{n-k} u(X) \mod g(X)$, where b(X) is remainder polynomial 206. At the same time that u(X) 203 is shifted into channel 207, u(X) 203 may also be shifted into LFSR 200 to compute b(X) 206. Once u(X) 203 has been completely shifted into LFSR 200, the contents of registers 211-214 become the coefficients of b(X) 206. The remaining digits of codeword 204 may then be generated by shifting b(X) 206 into channel 207. This occurs when switch 205 is in position B. Thus, switch 205 flips from position A to position B immediately after u(X) 203 has been shifted into the channel 207 and into the LFSR 200, thereby appending b(X) to u(X). By appending the coefficients of b(X) 206 to the coefficients of u(X) 203, LFSR 200 creates a codeword that is divisible by g(X).

Figure 3:
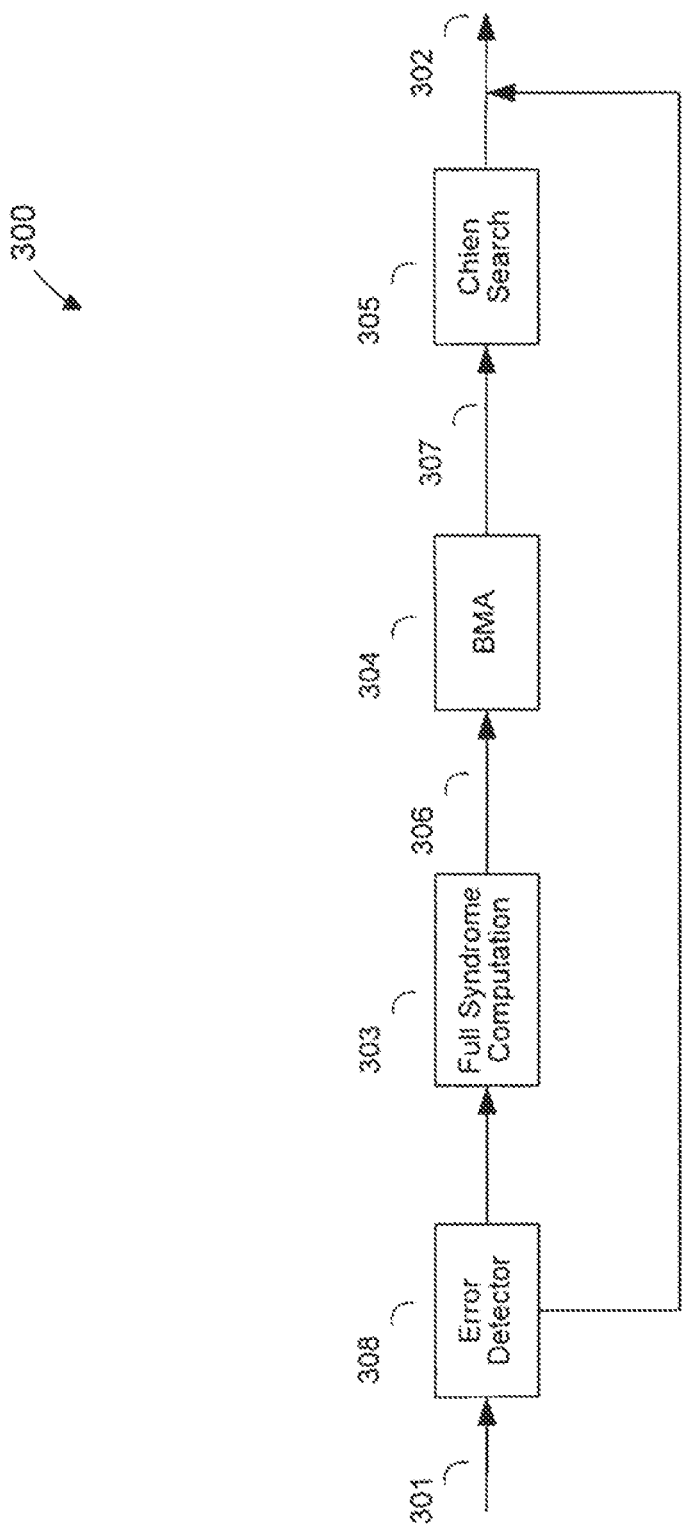
FIG. 3 shows a simplified block diagram of a BCH decoder in accordance with one embodiment of the invention.

Referring to FIG. 3, there is shown an implementation of a BCH decoder according to one embodiment of the invention. BCH decoder 300 may include error detector 308, full syndrome computer 303, Berlekamp-Massay algorithm (BMA) 304, and Chien Search 305. These components may collectively decode a received/stored codeword by: (1) detecting the presence of errors in the codeword, (2) computing the syndrome of the codeword, (3) computing the error-locater polynomial, and (4) determining the error locations from the roots of the error-locator polynomial and making the necessary corrections. For non-binary BCH codes, an error evaluation block may be needed following Chien Search 305. BMA and Chien Search are specific algorithms that can be used to perform steps 3 and 4 mentioned above. Although there exists other algorithms for performing these steps, in this and subsequent figures, BMA and Chien Search are referred to by name for clarity and specificity. In one embodiment, error detector 308, full syndrome computer 303, BMA 304, and Chien Search 305 may be implemented using special-purpose hardware. This implementation may advantageously decode the received/stored codeword at high throughput.

Error detector 308 may detect errors in received codeword r(X) 301 by determining if received codeword r(X) 301 is a valid codeword of the employed BCH code. All valid codewords are multiples of the generator polynomial g(X), as mentioned previously. Therefore, received codeword 301 is free of detectable errors only if r(X)/g(X) yields a zero remainder. In one embodiment of the invention, error detector 308 is implemented in hardware. A hardware implementation of error detector 308 may comprise LFSR 200 of FIG. 2. Referring back to FIG. 2, LFSR 200 computes the remainder polynomial b(X) 206 resulting from the division of user input polynomial u(X) 203 by g(X), whose coefficients are gains 221-223. Thus, LFSR 200 performs the exact computation required by error detector 308, with the exception that received codeword 301 is shifted into LFSR 200 as u(X) 203, instead of a dataword. Thus, if the contents of registers 211-214 are all zero after received codeword 301 is shifted into LFSR 200, then received codeword 301 is free of detectable errors. Furthermore, if the application of the invention is such that the BCH encoder and BCH decoder are located in physical proximity to each other, such as in a storage application, one copy of LFSR 200 may be used for both encoding and error detection, as long as the write and read of registers 211-214 do not occur at the same time.

Full syndrome computer 303 computes the syndrome of received codeword 301. A syndrome in the context of BCH decoding is a vector with 2t components, $(S_1, S_2, \ldots S_{2t})$, calculated from a codeword that indicates the presence of errors. For a received codeword r(X), the $i^{th}$ syndrome component is related to the $\alpha^i$ root of the code's generator polynomial g(X) in the following manner:

$$S_i = r(\alpha^i) = r_0 + r_1\alpha^i + r_2\alpha^{2i} + \ldots + r_{n-1}\alpha^{(n-1)i} \quad \text{(Eq. 3)}$$

The syndrome of a received codeword r(X) is identically zero if and only if the received codeword r(X) is valid codeword and a multiple of g(X). Therefore, if all 2t syndrome components of a received codeword r(X) are equal to zero, then either no errors are present in the received codeword or the errors present form another valid codeword, and are thus undetectable.

With continued reference to FIG. 3, BMA 304 computes the "error-locator polynomial" 307 of received codeword 301 from syndrome 306. The $j^{th}$ root, $Z_j$, of the error-locator polynomial, $L(X)=\sigma_0+\sigma_1 X^1+\ldots+\sigma_v X^v$, is related to the error pattern in the following way:

$$Z_j=\alpha^{-j}, \quad \text{(Eq. 4)}$$

where j is the degree of the polynomial term of received codeword 301 that has an erroneous coefficient. Furthermore, the syndrome of received codeword 301 and L(X) 307 are related by the following equations:

$$S_1 + \sigma_1 = 0 \quad \text{(Eqs. 5)}$$
$$S_2 + \sigma_1 S_1 + 2\sigma_2 = 0$$
$$S_3 + \sigma_1 S_2 + \sigma_2 S_1 + 3\sigma_3 = 0$$
$$\vdots$$
$$S_v + \sigma_1 S_{v-1} + \ldots + \sigma_{v-1} S_1 + v\sigma_v = 0$$

As mentioned previously, BMA 308 can employ the well-known Berlekamp-Massey algorithm to solve the above equations to compute L(X) 307. Other algorithms may also be used to compute L(X) 307, such as the Peterson-Gorenstein-Zierler algorithm and the Euclidean algorithm.

Chien Search 305 computes the roots of error-locater polynomial 307 to determine the error locations in received codeword 301. Chien Search 305 can employ the well-known and efficient Chien search algorithm, although other algorithms may also be used. Chien Search 305 functions by decoding received codeword 301, $r(X)=r_{n-1}X^{n-1}+r_{n-2}X^{n-2}+\ldots+r_0$, digit by digit. To decode the $r_i$ term, Chien Search 305 checks if $L(\alpha^{-i})=0$. If $\alpha^{-i}$ is indeed a root of L(X), then $r_i$ is an erroneous digit. Otherwise, $r_i$ is error free. In binary BCH coding, the errors may then be readily fixed via a bit flip. In nonbinary BCH coding, the correct values at the error locations may be identified and used to correct the erroneous digit.

Accordingly, the output of Chien Search 305 is decoded codeword 302. As discussed previously, decoded codeword 302 may still contain errors if, for example, the correction power of the employed BCH code is insufficient. Decoded information 104 in FIG. 1 may include one or more decoded codewords 302.

While a hardware-based implementation of components 308, 303, 304, and 305 may allow decoder 300 to have high throughput, this implementation may be costly in energy usage and in silicon area. Accordingly, the functionality of these components may instead by executed in firmware. However, firmware implementations may be undesirably slow, and may not meet the throughput requirements of a communications or storage system.

Therefore, embodiments of the invention may implement part of the BCH decoding process in hardware and part of the BCH decoding process in firmware to take advantage of the desirable characteristics of both types of implementation.

Figure 4:
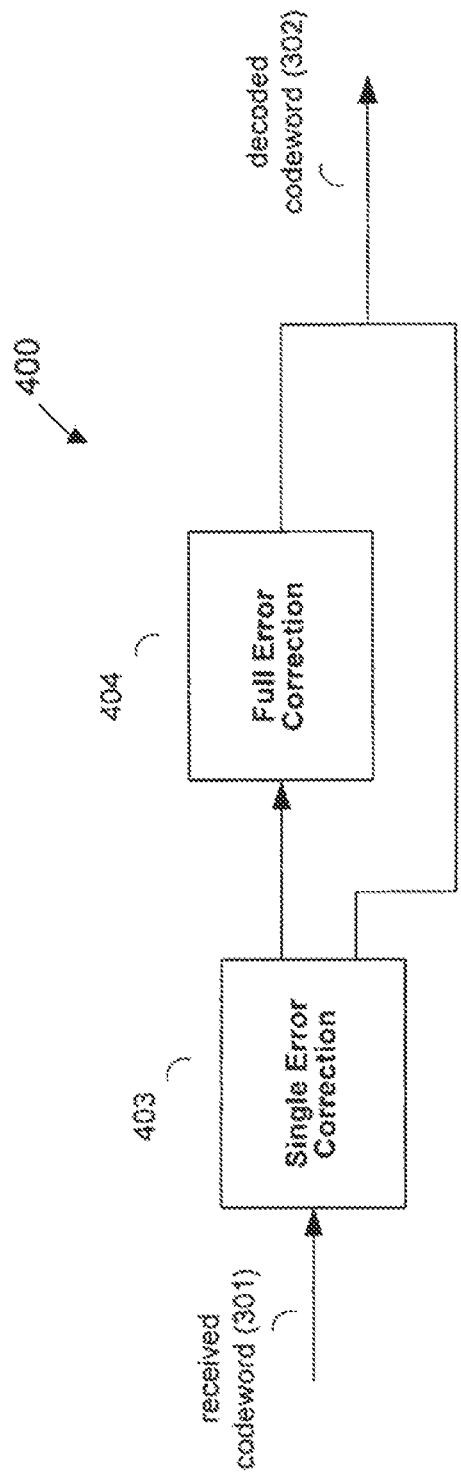
FIG. 4 shows a simplified block diagram of a BCH decoder in accordance with another embodiment of the invention.

FIG. 4 shows a block diagram of a BCH decoder according to another embodiment of the invention. In contrast to decoder 300, decoder 400 comprises two functional blocks, single error corrector 403 and full error corrector 404. Single error corrector 403 is designed to correct one error per codeword. Full error corrector 404 is designed to correct t errors per codeword, the maximum number of errors allowable by the employed code. In accordance with the discussion above, single error corrector 403 is preferably implemented in special-purpose hardware while full error corrector 404 is implemented in firmware. This hybrid implementation scheme is advantageous in terms of power consumption and area usage for the reasons discussed below.

Because the computations required for single error correction is significantly simpler than that of full error correction, single error corrector 403 hardware may be designed to use less power and have less silicon area than a hardware-based full error corrector. Since the area and power consumption of firmware is small in comparison to special-purpose hardware, decoder 400 in its entirety may also be more power-saving and area-efficient than an exclusively hardware-based decoder. Moreover, in some communications/storage systems, the frequency of occurrence of single error patterns may be much higher than that of multiple error patterns. By eliminating the need for firmware operation during decoding of codewords with only one error, decoder 400 also operates at special-purpose hardware speed a significant part of the time. Therefore, decoder 400 takes advantage of both the high speed of hardware and the low power consumption and area of firmware. These advantages are particular important in scenarios where speed is an issue, such as when the raw page error rate is too high in a storage application.

When a received codeword 301 containing any number of errors arrives at decoder 400, single error corrector 403 functions to correct one error in received codeword 301. Single error corrector 403 may also correct zero errors if codeword 301 is error free. If received codeword 301 does indeed contain only one or zero errors, and then the output of single error corrector 301 is decoded codeword 302 and is routed directly to the output of decoder 400. On the other hand, if single error corrector 403 fails to correct the errors because there are more than one errors in received codeword 301, the output of single error corrector 403 is directed to full error corrector 404, where the incorrectly corrected codeword (e.g., the output of single error corrector 403) is subjected to the full error-correcting capability of the BCH code. The output of full error corrector 404 is then directed to the output of decoder 400.

Figure 5:
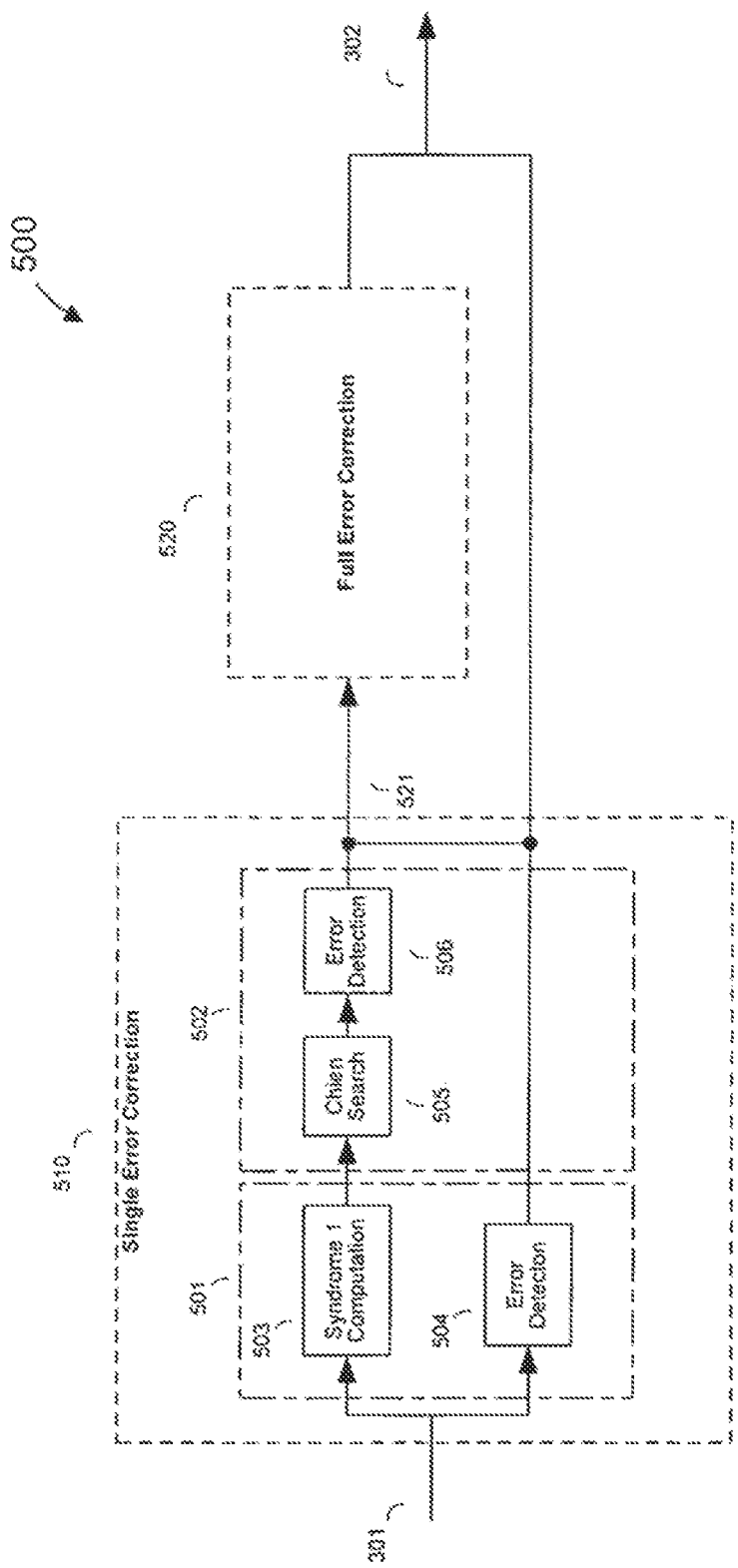
FIG. 5 shows a simplified block diagram of one implementation of the BCH decoder shown in FIG. 4.

A particular implementation architecture of decoder 400 is shown in FIG. 5. Accordingly, BCH decoder 500 includes hardware-based single error corrector 510 and firmware-based full error corrector 520. Single error corrector 510 functions to correct a single error in received codeword 301. In general, correcting one error in a codeword requires only the $S_1$ component of the codeword's syndrome. In addition, the full error locator polynomial L(X), and consequently BMA, and Chien Search are also not needed.

Figure 7B:
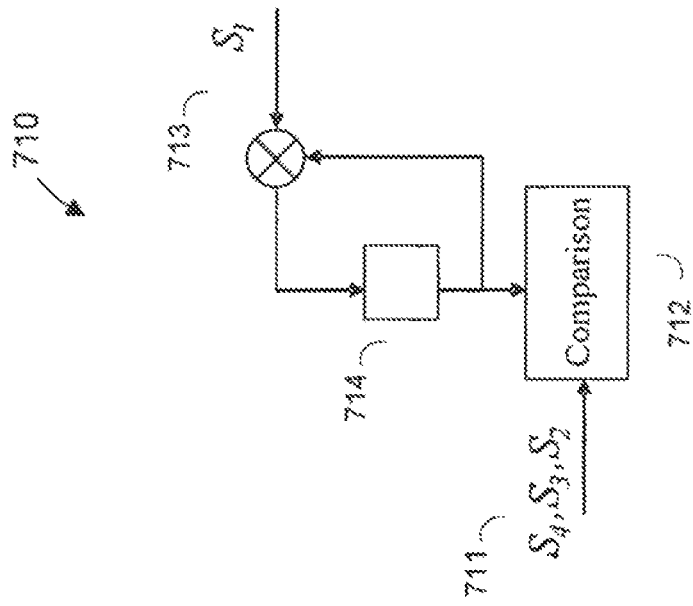
FIG. 7B shows a simplified block diagram of a system used to identify single error patterns in a received codeword.
Figure 7A:
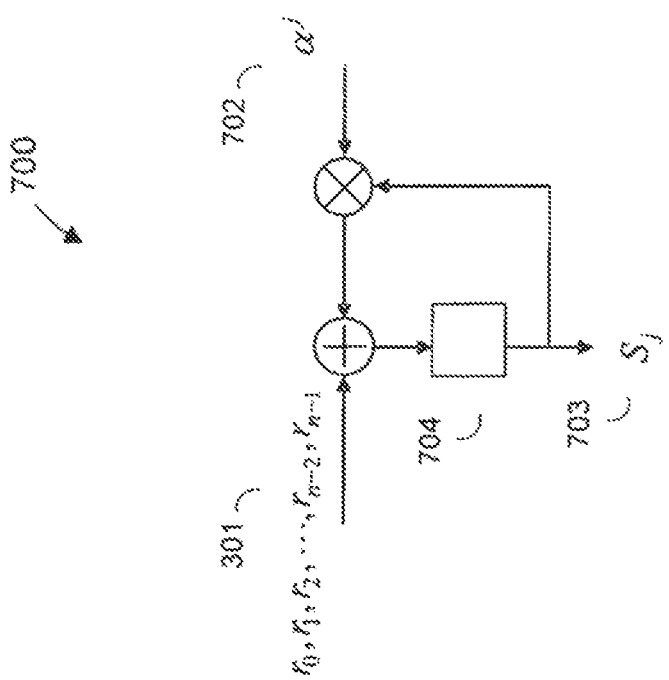
FIG. 7A shows a simplified block diagram of a system used for syndrome computation.

In accordance with the above discussion, single error corrector 510 comprises two pipelined stages, stage 501 and stage 502, where pipeline stage 501 comprises a syndrome 1 computer 503 that computes the $S_1$ component of the syndrome of received codeword 301. A system that may be used to implement syndrome 1 computer 503 is shown in FIG. 7A. Also in pipeline stage 501 is error detector 504, which may be implemented using the LFSR 200 of FIG. 2, as described previously in relation to FIG. 3. the computations performed by syndrome 1 computer 503 and error detector 504 occur concurrently so that decoder operation may proceed to pipeline stage 502 immediately after error detector 504 determines whether or not errors exist in received codeword 301. If detectable errors are not present in received codeword 301, then received codeword 301 is equal to decoded codeword 302 and is routed directly to the output of decoder 500. In this case, the syndrome component computed by syndrome 1 computer 503 is discarded If errors are detected by error detector 504, then the syndrome component computed by syndrome 1 computer 503 is shifted into pipeline stage 502. At the same time, a new received codeword 301 may enter pipeline stage 501, thereby increasing the throughput of the system. Pipeline stage 502 comprises a component operable to correct an error in received codeword 301 (e.g., based on a polynomial root calculation) and another error detector 506, which may be implemented in the same way as error detector 504. In some embodiments, the component operable to correct errors may be implemented in pipeline stage 502 as Chien search 505 that can employ a Chien search algorithm. Chien search 505 finds and corrects the single error based on the syndrome component which Chien search 505 receives as input. The output of Chien search 505 is directed into error detector 506 to determine if any errors remain. If there is indeed only one error in received codeword 301 and Chien search 505 successfully corrects the error, then error detector 506 should find zero errors and decoded codeword 302 is routed to the output of decoder 500. In this scenario, full error corrector 520 and firmware operation is bypassed.

Otherwise, the pipeline halts and the original received codeword goes into firmware-based full error corrector 520, where the errors (up to the correction power of the code) are corrected. Full error corrector 520 may be implemented using a system similar to decoder 300 except without the initial error detector 308. Other firmware-based methods and algorithms may also be used to implement full error corrector 520. In certain applications, such as storage systems, the output of decoder 500 may be routed to a page buffer. A page buffer may collect a certain number (e.g. a page) of decoded datawords 302 as the decoded datawords become available, and then provide the decoded datawords all at once to a device or application, such as a display or a memory. In one embodiment of the invention, a page buffer may be provided at each pipeline stage 501 and 502.

Figure 6:
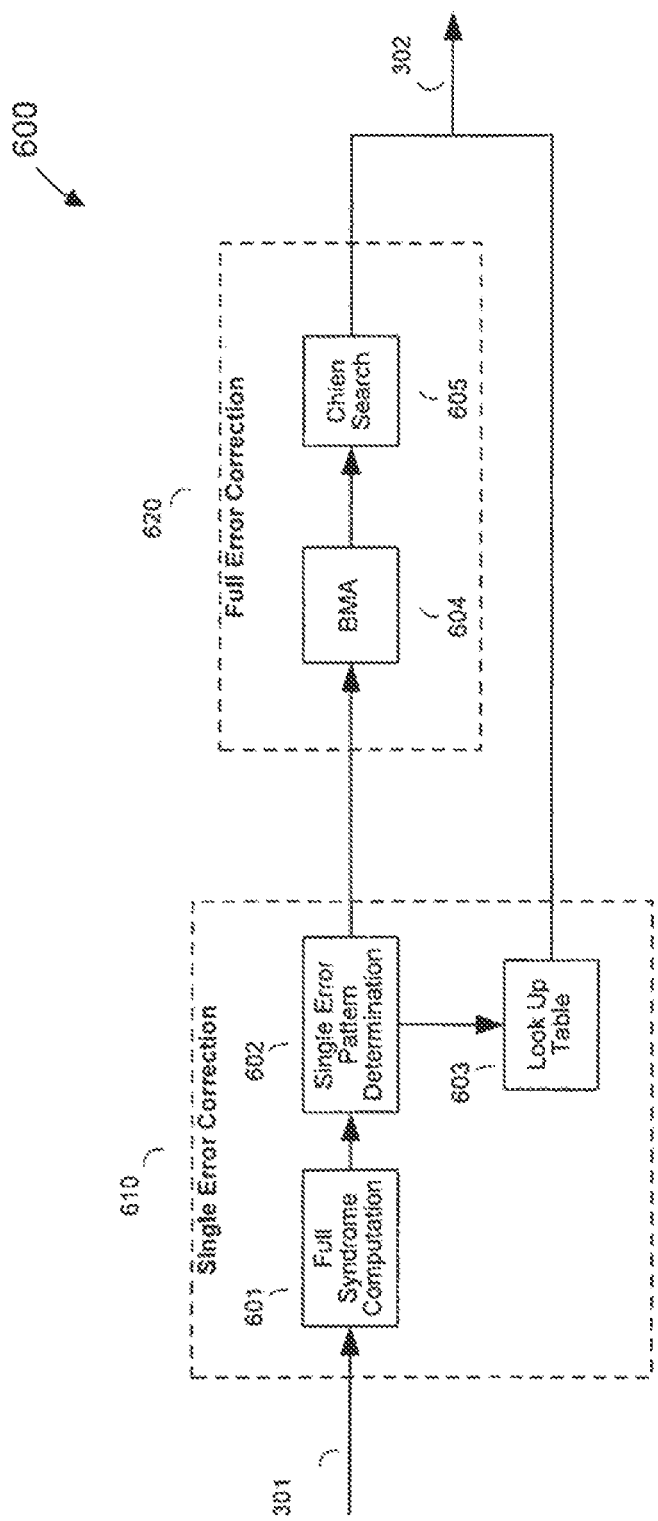
FIG. 6 shows a simplified block diagram of another implementation of the BCH decoder shown in FIG. 4.

A second implementation architecture of decoder 400 is shown in FIG. 6. Accordingly, BCH decoder 600 also includes hardware-based single error corrector 610 and firmware-based full error corrector 620. In this implementation, single error corrector 610 operates with one pipeline stage and comprises full syndrome computer 601, single error pattern determiner 602, and look up table (LUT) 603. Full syndrome computer 601 computes all 2t terms of the syndrome of received codeword 301 and directs the results to single error pattern determiner 602. Single error pattern determiner 602 uses the syndrome to determine whether or not received codeword 301 contains only one error. Thus, decoder 500 of FIG. 5 and decoder 600 differ in that the former tries to correct one error and then determines whether or not the correction is successful, while the latter determines whether the number of errors in received codeword 301 is greater than one prior to attempting error correction. Block diagrams of systems that may be used to implement full syndrome computer 601 and single error pattern determiner 602 are shown in FIG. 7A and FIG. 7B, respectively.

If single error pattern determiner 602 determines that received codeword 301 contains one or zero errors, then Look Up Table (LUT) 603 is used to correct the error, if any. LUT 603 stores the error locations corresponding to each possible $S_1$ value so that error correction can be performed based on the computed first syndrome term. LUT 603 may be implemented using any appropriate hardware architecture, such as a ROM. The output of LUT 603, decoded codeword 302, is routed directly to the output of decoder 600, thereby bypassing firmware operation.

On the other hand, if single error pattern determiner 602 determines that there is in face more than one error in received codeword 301, then full error corrector 620 and firmware operation cannot be bypassed. In this case, full error corrector 620 is used to correct all the errors in received codeword 301, up to the correction power of the BCH code. In one embodiment, full error corrector may comprise BMA 604 and Chien search 605. BMA 604 may use the syndrome computed by full syndrome computer 601 to determine error-locator polynomial L(X). Chien search 605 may use L(X) to locate and fix the errors. The specific operations of BMA 604 and Chien search 605 were discussed previously in relation to FIG. 3.

Because the operation time of decoder 600 may vary depending on the number of errors in each received codeword 302, it may be desirable in some applications to use a page buffer to collect the decoded codewords 302 at the output of decoder 600. The contents of the page buffer may then be provided all at once. A FIFO may also be used for this purpose.

Referring to FIG. 7A, there is shown a block diagram of a system 700 that may be used to compute the syndrome of a received codeword r(X) 301. System 700 computes $S_j$ by multiplying powers of the $j^{th}$ root $\alpha^j$ 702 of the generator polynomial g(X) with the coefficients of received codeword r(X) 301 according to Equation 3. Each polynomial term of $S_j$ is stored in register 704, before the polynomial term is shifted sequentially into the output line 703 to form $S_j$. Multiple copies of system 700 may be used to compute the full syndrome of received codeword 301, although more efficient architectures exist and may be preferably used.

Referring to FIG. 7B, there is shown a block diagram of a system 710 that may be used to implement the single error pattern determiner 602 of FIG. 6. In general, the syndrome components of a binary BCH encoded received codeword r(X) containing a single error follow the following identifiable pattern:

$$S_1 = r(\alpha) = \alpha^j$$
$$S_2 = r(\alpha^2) = \alpha^{2j} = S_1^2$$ (Eqs. 6)
$$S_3 = r(\alpha^3) = \alpha^{3j} = S_1^3$$
...

System 710 utilizes this property to determine if a single error pattern exists in a received codeword. In FIG. 7B, powers of the first syndrome component $S_1$ 713 is computed and stored in register 714. The content of register 714 is then compared to the other syndrome components 711 by a comparator 712 to determine if Equations 6 hold. Comparator 712 may be implemented using any appropriate system, such as a prefabricated comparator chip or an operational amplifier-based comparator. It can be shown that in the above-described process, only the odd-numbered syndrome terms need to be compared, since the even-numbered syndrome terms will automatically satisfy the Equations 6 for binary BCH code.

Referring now to FIGS. 8-14, various exemplary implementations of the present invention are shown.

Figure 8:
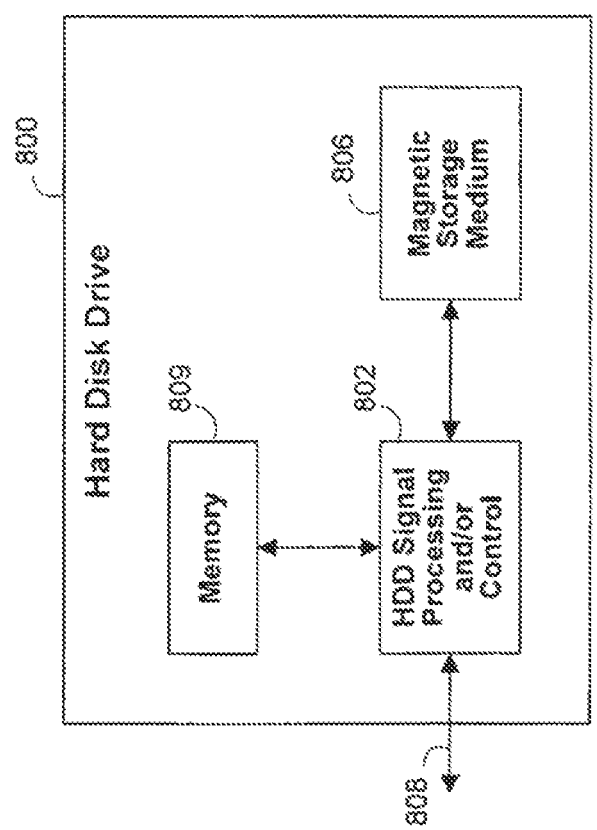
FIG. 8 is a block diagram of an exemplary hard disk drive that can employ the disclosed technology.

Referring now to FIG. 8, the present invention can be implemented in a hard disk drive (HDD) 800. The present invention may implement either or both signal processing and/or control circuits, which are generally identified in FIG. 8 at 802. In some implementations, the signal processing and/or control circuit 802 and/or other circuits (not shown) in the HDD 800 may process data, perform coding and/or encryption, perform calculations, and/or format data that is output to and/or received from a magnetic storage medium 806.

The HDD 800 may communicate with a host device (not shown) such as a computer, mobile computing devices such as personal digital assistants, cellular phones, media and MP3 players and the like, and/or other devices via one or more wired or wireless communication links 808. The HDD 800 may be connected to memory 809 such as random access memory (RAM), nonvolatile memory such as flash memory, read only memory (ROM) and/or other suitable electronic data storage.

Figure 9:
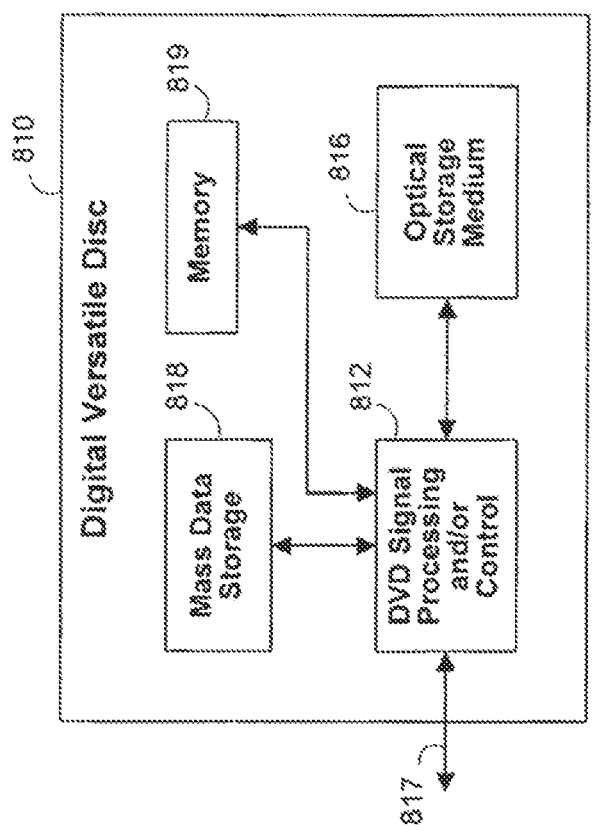
FIG. 9 is a block diagram of an exemplary digital versatile disc drive that can employ the disclosed technology.

Referring now to FIG. 9, the present invention can be implemented in a digital versatile disc (DVD) drive 810. The present invention may implement either or both signal processing and/or control circuits, which are generally identified in FIG. 9 at 812, and/or mass data storage 818 of the DVD drive 810. The signal processing and/or control circuit 812 and/or other circuits (not shown) in the DVD drive 810 may process data, perform coding and/or encryption, perform calculations, and/or format data that is read from and/or data written to an optical storage medium 816. In some implementations, the signal processing and/or control circuit 812 and/or other circuits (not shown) in the DVD drive 810 can also perform other functions such as encoding and/or decoding and/or any other signal processing functions associated with a DVD drive.

The DVD drive 810 may communicate with an output device (not shown) such as a computer, television or other device via one or more wired or wireless communication links 817. The DVD drive 810 may communicate with mass data storage 818 that stores data in a nonvolatile manner. The mass data storage 818 may include a hard disk drive (HDD). The HDD may have the configuration shown in FIG. 8. The HDD may be a mini HDD that includes one or more platters having a diameter that is smaller than approximately 1.8". The DVD drive 810 may be connected to memory 819 such as RAM, ROM, nonvolatile memory such as flash memory and/or other suitable electronic data storage.

Figure 10:
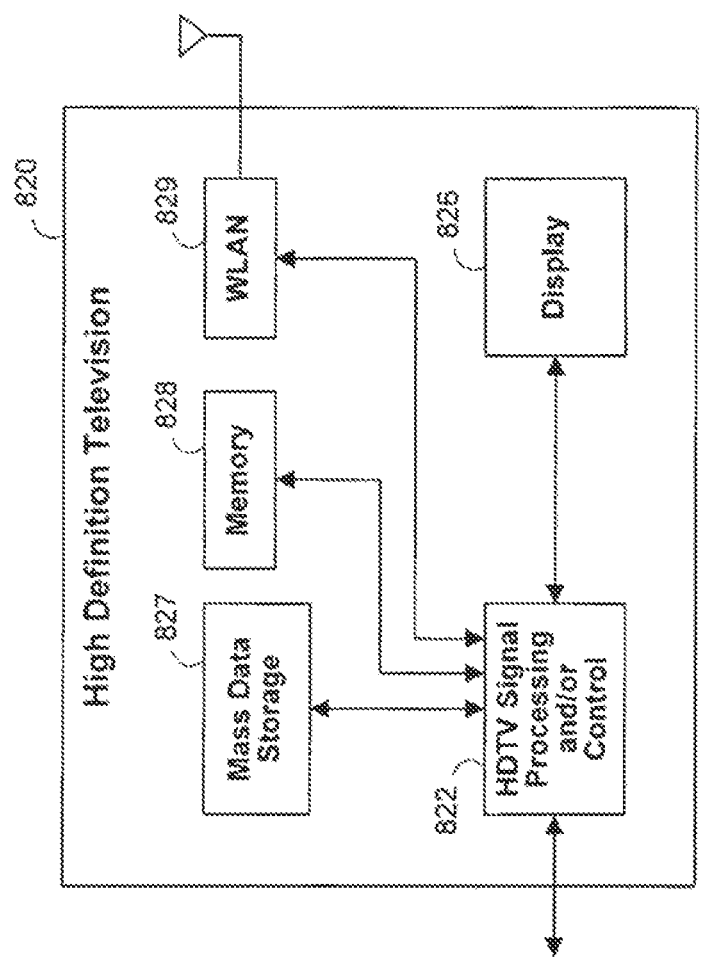
FIG. 10 is a block diagram of an exemplary high definition television that can employ the disclosed technology.

Referring now to FIG. 10, the present invention can be implemented in a high definition television (HDTV) 820. The present invention may implement either or both signal processing and/or control circuits, which are generally identified in FIG. 10 at 822, a WLAN network interface 829 and/or mass data storage 827 of the HDTV 820. The HDTV 820 receives HDTV input signals in either a wired or wireless format and generates HDTV output signals for a display 826. In some implementations, signal processing circuit and/or control circuit 822 and/or other circuits (not shown) of the HDTV 820 may process data, perform coding and/or encryption, perform calculations, format data and/or perform any other type of HDTV processing that may be required.

The HDTV 820 may communicate with mass data storage 827 that stores data in a nonvolatile manner such as optical and/or magnetic storage devices for example hard disk drives and/or DVD drives. At least one HDD may have the configuration shown in FIG. 8 and/or at least one DVD drive may have the configuration shown in FIG. 9. The HDD may be a mini HDD that includes one or more platters having a diameter that is smaller than approximately 1.8". The HDTV 820 may be connected to memory 828 such as RAM, ROM, nonvolatile memory such as flash memory and/or other suitable electronic data storage. The HDTV 820 also may support connections with a WLAN via a WLAN network interface 829.

Figure 11:
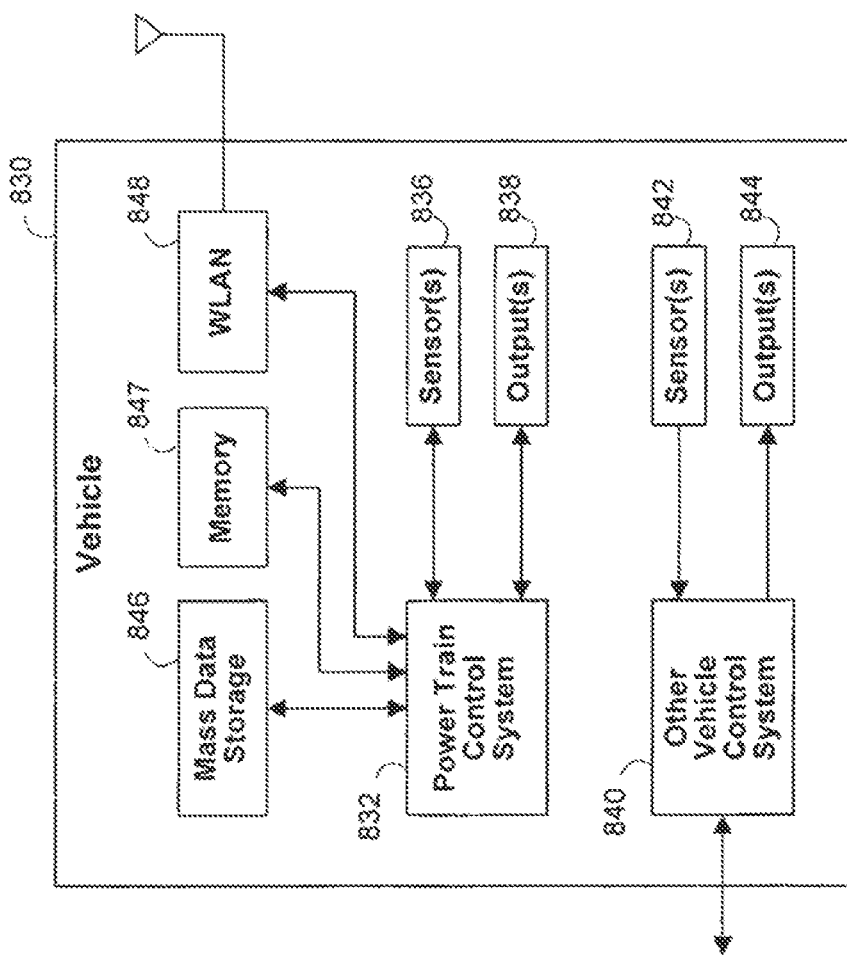
FIG. 11 is a block diagram of an exemplary vehicle that can employ the disclosed technology.

Referring now to FIG. 11, the present invention implements a control system of a vehicle 830, a WLAN network interface 848 and/or mass data storage 846 of the vehicle control system. In some implementations, the present invention may implement a powertrain control system 832 that receives inputs from one or more sensors such as temperature sensors, pressure sensors, rotational sensors, airflow sensors and/or any other suitable sensors and/or that generates one or more output control signals such as engine operating parameters, transmission operating parameters, breaking parameters, and/or other control signals.

The present invention may also be implemented in other control systems 840 of the vehicle 830. The control system 840 may likewise receive signals from input sensors 842 and/or output control signals to one or more outputs devices 844. In some implementations, the control system 840 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 832 may communicate with mass data storage 846 that stores data in a nonvolatile manner. The mass data storage 846 may include optical and/or magnetic storage devices for example hard disk drives and/or DVD drives. At least one HDD may have the configuration shown in FIG. 8 and/or at least one DVD drive may have the configuration shown in FIG. 9. The HDD may be a mini HDD that includes one or more platter having a diameter that is smaller than approximately 1.8". The powertrain control system 832 may be connected to memory 847 such as RAM, ROM, nonvolatile memory such as flash memory and/or other suitable electronic data storage. The powertrain control system 832 also may support connections with a WLAN via WLAN network interface 848. The control system 840 may also include mass data storage, memory and/or a WLAN network interface (all not shown).

Figure 12:
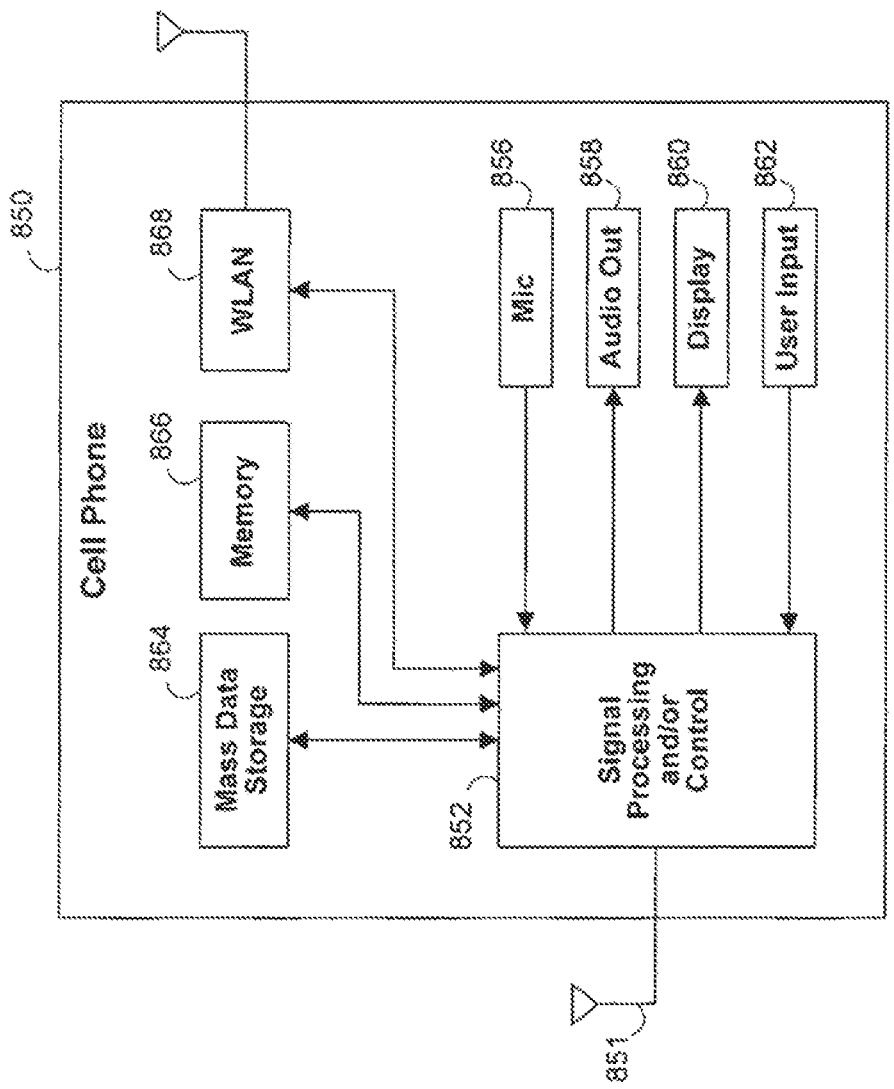
FIG. 12 is a block diagram of an exemplary cell phone that can employ the disclosed technology.

Referring now to FIG. 12, the present invention can be implemented in a cellular phone 850 that may include a cellular antenna 851. The present invention may implement either or both signal processing and/or control circuits, which are generally identified in FIG. 12 at 852, a WLAN network interface 868 and/or mass data storage 864 of the cellular phone 850. In some implementations, the cellular phone 850 includes a microphone 856, an audio output 858 such as a speaker and/or audio output jack, a display 860 and/or an input device 862 such as a keypad, pointing device, voice actuation and/or other input device. The signal processing and/or control circuits 852 and/or other circuits (not shown) in the cellular phone 850 may process data, perform coding and/or encryption, perform calculations, format data and/or perform other cellular phone functions.

The cellular phone 850 may communication with mass data storage 864 that stores data in a nonvolatile manner such as optical and/or magnetic storage devices for example hard disk drives and/or DVD drives. At least one HDD may have the configuration shown in FIG. 8 and/or at least one DVD may have the configuration shown in FIG. 9. The HDD may be a mini HDD that includes one or more platters having a diameter that is smaller than approximately 1.8". The cellular phone 850 may be connected to memory 866 such as RAM, ROM, nonvolatile memory such as flash memory and/or other suitable electronic data storage. The cellular phone 850 also may support connections with a WLAN via WLAN network interface 868.

Figure 13:
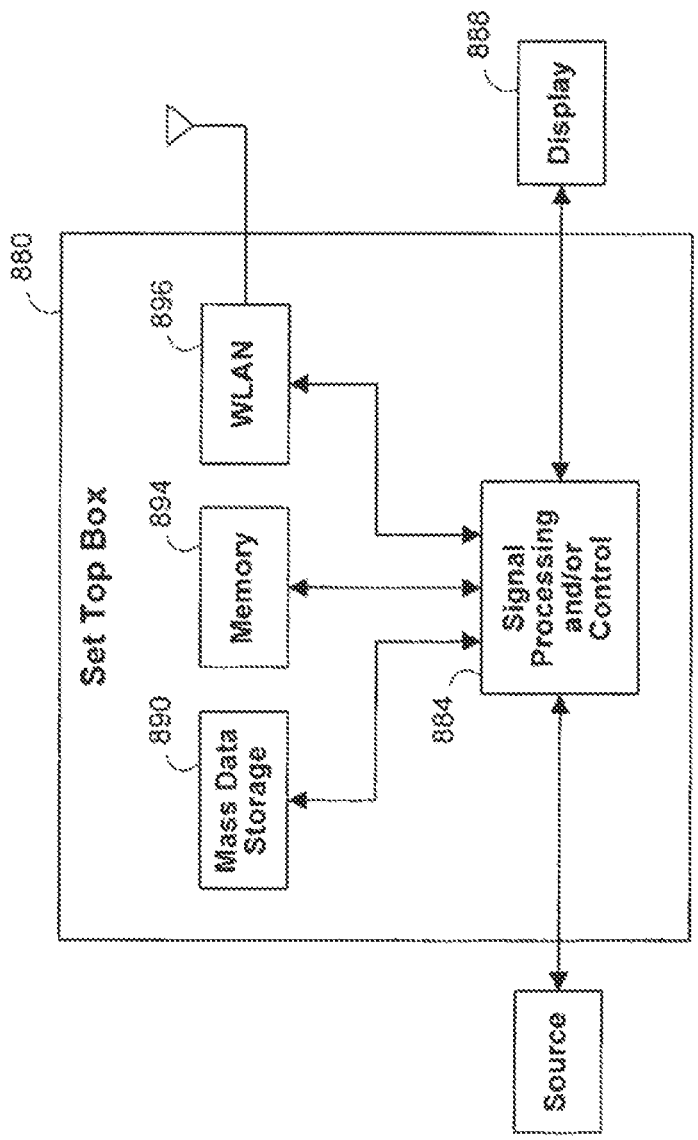
FIG. 13 is a block diagram of an exemplary set top box that can employ the disclosed technology.

Referring now to FIG. 13, the present invention can be implemented in a set top box 880. The present invention may implement either or both signal processing and/or control circuits, which are generally identified in FIG. 13 at 884, a WLAN network interface 896 and/or mass data storage 890 of the set top box 880. The set top box 880 receives signals from a source such as a broadband source and outputs standard and/or high definition audio/video signals suitable for a display 888 such as a television and/or monitor and/or other video and/or audio output devices. The signal processing and/or control circuits 884 and/or other circuits (not shown) of the set top box 880 may process data, perform coding and/or encryption, perform calculations, format data and/or perform any of the set top box function.

The set top box 880 may communicate with mass data storage 890 that stores data in a nonvolatile manner. The mass data storage 890 may include optical and/or magnetic storage devices for example hard disk drives and/or DVD drives. At least one HDD may have the configuration shown in FIG. 8 and/or at least one DVD drive may have the configuration shown in FIG. 9. The HDD may be a min HDD that includes one or more platters having a diameter that is smaller than approximately 1.8". The set top box 880 may be connected to memory 894 such as RAM, ROM, nonvolatile memory such as flash memory and/or other suitable electronic data storage. The set top box 880 also may support connections with a WLAN via a WLAN network interface 896.

Figure 14:
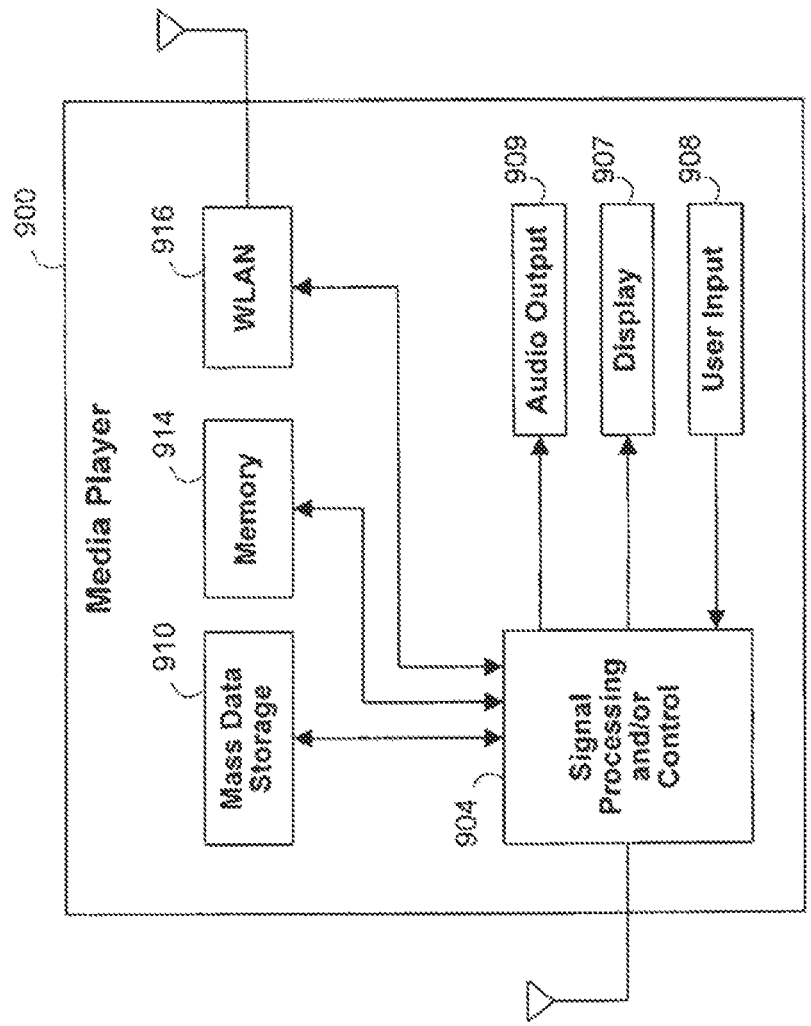
FIG. 14 is a block diagram of an exemplary media player that can employ the disclosed technology.

Referring now to FIG. 14, the present invention can be implemented in a media player 900. The present invention may implement either or both signal processing and/or control circuits, which are generally identified in FIG. 14 at 904, a WLAN network interface 916 and/or mass data storage 910 of the media player 900. In some implementations, the media player 900 includes a display 907 and/or a user input 908 such as a keypad, touchpad and the like. In some implementations, the media player 900 may employ a graphical user interface (GUI) that typically employs menus, drop down menus, icons and/or a point-and-click interface via the display 907 and/or user input 908. The media player 900 further includes an audio output 909 such as a speaker and/or audio output jack. The signal processing and/or control circuits 904 and/or other circuits (not shown) of the media player 900 may process data, perform coding and/or encryption, perform calculations, format data and/or perform any other media player function.

The media player 900 may communicate with mass data storage 910 that stores data such as compressed audio and/or video content in a nonvolatile manner. In some implementations, the compressed audio files include files that re compliant with MP3 format or other suitable compressed audio and/or video formats. The mass data storage may include optical and/or magnetic storage devices for example hard disk drives and/or DVD drives. At least one HDD may have the configuration shown in FIG. 8 and/or at least one DVD drive may have the configuration shown in FIG. 9. The HDD may be a mini HDD that includes one or more platters having a diameter that is smaller than approximately 1.8". The media player 900 may be connected to memory 914 such as RAM, ROM, nonvolatile memory such as flash memory and/or other suitable electronic data storage. The media player 900 also may support connections with a WLAN via WLAN network interface 916. Still other implementations in addition to those described above are contemplated.

The foregoing describes systems and methods for implementing a power-saving area-efficient hybrid BCH coding system. Those skilled in the art will appreciate that the invention can be practiced by other than the described embodiments, which are presented for the purpose of illustration rather than of limitation.

What is claimed is:

1. A decoder comprising:
   first circuitry configured to correct up to one error in a codeword using a first error correcting process;
   second circuitry configured to correct errors in the codeword using a second error correcting process; and
   selection circuitry configured to:
      based on determining that the codeword contains zero errors, decode the codeword with the first circuitry using the first error correcting process;
      based on determining that the codeword contains one error, decode the codeword with the first circuitry using the first error correcting process; and
      based on determining that the codeword contains more than one error, decode the codeword with the second circuitry using the second error correcting process.

2. The decoder of claim 1, wherein the first circuitry comprises a first pipeline stage and a second pipeline stage.

3. The decoder of claim 2, wherein the first pipeline stage comprises:
   an error detection component that detects the presence of errors in the codeword; and
   a syndrome computation component that computes a first syndrome component of the codeword, wherein the error detection component and the syndrome computation component operate concurrently on the codeword.

4. The decoder of claim 3, wherein the second pipeline stage comprises a polynomial root computation component that corrects errors in the codeword based on the first syndrome component to produce a corrected codeword.

5. The decoder of claim 4, wherein the second pipeline stage further comprises an error detection component that detects presence of errors in the corrected codeword.

6. The decoder of claim 2, wherein the second circuitry comprises:
   a syndrome computation component that computes a complete syndrome of the codeword;
   an error-locator polynomial computation component that computes an error-locator polynomial of the codeword; and
   a polynomial root computation component that computes roots of the error-locator polynomial.

7. The decoder of claim 1, wherein the first circuitry comprises:
   a syndrome computation component that computes a complete syndrome of the codeword;
   a single error pattern determination component that determines when up to a single error is present in the codeword; and
   a look-up table for decoding the codeword when a single error is present in the codeword and when zero errors are present in the codeword.

8. A method of correcting errors in a codeword, the method comprising:
   determining whether an error is present in the codeword;
   based on determining that zero errors are present in the codeword, decoding the codeword using a first error correcting process for correcting up to one error in the codeword;
   based on determining that one error is present in the codeword, decoding one error in the codeword using the first error correcting process for correcting up to one error in the codeword; and
   based on determining that more than one error is present in the codeword, decoding the codeword using a second error correcting process.

9. The method of claim 8, further comprising:
   computing a complete syndrome of the codeword; and
   determining, based on the computed complete syndrome, whether up to one error is present in the codeword.

10. The method of claim 8, wherein the decoding the codeword using the first error correcting process comprises performing a table-lookup based on the computed complete syndrome, and decoding the codeword based on the performed table-lookup.

11. The method of claim 8, wherein the second error correcting process comprises:
    computing an error-locator polynomial based on the complete syndrome; and
    computing roots of the error-locator polynomial to produce a corrected codeword.

12. A decoder comprising:
    syndrome circuitry configured to compute a first syndrome component of the codeword;
    first circuitry configured to decode the codeword using a first error correcting process for correcting up to one error in the codeword to produce a corrected codeword;
    detection circuitry configured to detect a presence of errors in the corrected codeword; and
    second circuitry configured to decode the corrected codeword using a second error correcting process based on detecting the presence of at least one error in the corrected codeword.

13. The decoder of claim 12, wherein the first circuitry is configured to decode a single error in the codeword.

14. The decoder of claim 12, wherein the first circuitry is configured to perform a polynomial root computation based on the first syndrome component.

15. The decoder of claim 14, wherein the polynomial root computation is performed using a Chien Search algorithm.

16. The decoder of claim 12, wherein the second circuitry is configured to:
    compute a complete syndrome of the codeword;
    compute an error-locator polynomial based on the complete syndrome; and
    compute roots of the error-locator polynomial to produce a corrected codeword.

17. A method of correcting errors in a codeword, the method comprising:
    computing a first syndrome component of the codeword;
    decoding the codeword using a first error correcting process for correcting up to one error in the codeword to produce a corrected codeword;
    detecting a presence of errors in the corrected codeword; and
    based on detecting the presence of at least one error in the corrected codeword, decoding at least one error in the corrected codeword using a second error correcting process.

18. The method of claim 17, wherein decoding the codeword using the first error correcting process comprises comprises decoding a single error.

19. The method of claim 18, wherein decoding the single error comprises performing a polynomial root computation based on the first syndrome component.

20. The method of claim 19, wherein the polynomial root computation is performed using a Chien Search algorithm.

21. The method of claim 17, wherein decoding at least one error in the correct codeword comprises:
    computing a complete syndrome of the codeword;
    computing an error-locator polynomial based on the complete syndrome; and
    computing roots of the error-locator polynomial to produce a corrected codeword.

* * * * *